(12) United States Patent
Groeninger

(10) Patent No.: US 7,642,104 B2
(45) Date of Patent: Jan. 5, 2010

(54) METHOD FOR CONTACTING SEMICONDUCTOR COMPONENTS WITH A TEST CONTACT

(75) Inventor: Horst Groeninger, Maxhuette-Haidhof (DE)

(73) Assignee: Infineon Technologies AG, Munich (DE)

( * ) Notice: Subject to any disclaimer, the term of this patent is extended or adjusted under 35 U.S.C. 154(b) by 236 days.

(21) Appl. No.: 11/456,122

(22) Filed: Jul. 7, 2006

(65) Prior Publication Data

US 2007/0007514 A1    Jan. 11, 2007

(30) Foreign Application Priority Data

Jul. 7, 2005    (DE)    .................. 10 2005 032 142

(51) Int. Cl.
*H01L 21/66*    (2006.01)
*G01R 31/26*    (2006.01)
(52) U.S. Cl. .......................... 438/17; 438/18
(58) Field of Classification Search ........... 257/15, 257/14, 48; 438/18, 17
See application file for complete search history.

(56) References Cited

U.S. PATENT DOCUMENTS

| | | | | |
|---|---|---|---|---|
| 3,632,509 A | * | 1/1972 | Inami et al. .......... | 508/311 |
| 4,696,832 A | * | 9/1987 | Wright .................. | 200/278 |
| 5,661,042 A | * | 8/1997 | Fang et al. ............ | 438/17 |
| 6,162,652 A | * | 12/2000 | Dass et al. ............ | 438/18 |
| 6,528,125 B1 | * | 3/2003 | Jackson et al. ........ | 427/459 |
| 7,319,341 B1 | * | 1/2008 | Harms et al. .......... | 324/765 |
| 2002/0195746 A1 | * | 12/2002 | Hull et al. ............ | 264/401 |
| 2005/0140009 A1 | | 6/2005 | Groeninger | |
| 2005/0205865 A1 | * | 9/2005 | Kuan et al. ........... | 257/48 |

FOREIGN PATENT DOCUMENTS

| | | |
|---|---|---|
| JP | 5186888 | 7/1993 |
| JP | 08-338852 | 12/1994 |
| WO | 2004103040 | 11/2004 |

OTHER PUBLICATIONS

Antler, M. Fretting Corrosion of Solder-Coated Electrical Contacts, IEEE Transaction on Components, Hybrids, and Manufacturing Technology, vol. 7, Issue 1, Mar. 1984, pp. 129-138.

\* cited by examiner

*Primary Examiner*—Lex Malsawma
(74) *Attorney, Agent, or Firm*—Edell, Shapiro & Finnan, LLC

(57) ABSTRACT

A method for contacting an external contact area with a test contact is provided. The external contact area has a galvanically applied coating of a metal or a metal alloy. Before the contact is established between the external contact area and the test contact, the external contact area is wetted with a fluid including an inhibitor which contains an aliphatic hydrocarbon, a binder such as a white mineral oil and/or ethyl acetate, and a lubricant. The fluid lowers the contact resistance between the external contact area and the test contact.

11 Claims, 2 Drawing Sheets

METHOD FOR CONTACTING SEMICONDUCTOR COMPONENTS WITH A TEST CONTACT

CROSS REFERENCE TO RELATED APPLICATIONS

This application claims priority under 35 U.S.C. § 119 to German Application No. DE 10 2005 032 142.9, filed 07 Jul. 2005 and entitled "Method for Contacting Semiconductor Components with a Test Contact", the disclosure of which is hereby incorporated by reference in its entirety.

FIELD OF THE INVENTION

The invention relates to a method for contacting semiconductor components with a test contact.

BACKGROUND OF THE INVENTION

During the testing of semiconductor components during production, the external contacts of the semiconductor components are brought into contact with test heads of a tester in order to electrically connect the tester to the semiconductor components. As described in U.S. Published Patent Application No. 2005/0140009 to Groeninger (the disclosure of which is incorporated by reference in its entirety), external contact areas are increasingly arranged on the underside of electronic components. These are used for connection with higher-level circuit parts and replace the contact pins previously arranged at the edge in the form of external flat conductors.

Before an external contact area is connected to the higher-level circuit arrangement or to solder pads, its coated with a layer of solderable material. This layer is formed from metals or metal alloys that are galvanically deposited on the external contact area and, in this process, forms a matte surface with sharp edges. However, such a galvanically deposited layer has a disadvantageous effect on the transition and contact resistance during functional tests of the electronic component. This, in turn, impairs the life of the elastic test contacts, especially since these are contaminated with the layer material of the external contact areas even after a few test cycles. The test contacts must be frequently cleaned or exchanged. The fluctuating transition resistances also impair the yield of the first test sequences (this yield is called the "first pass yield"). Accordingly, these first test sequences must be repeated in order to find out whether the yield losses are caused by faulty components or by large transition resistances. These subsequent tests increase the expenditure and lead to a low production throughput.

SUMMARY OF THE INVENTION

The present invention provides, inter alia, a method wherein the external contact areas and the test contacts are connected in such a manner that the yield during the tests and the production throughput is increased. In particular, a method for contacting external contact areas of a semiconductor component with a test contact is provided. In one embodiment, a coating of solderable material is applied to the external contact areas. The solderable material may include a metal (e.g., tin) or a metal alloy (e.g., tin/lead, tin/lead/silver, bismuth/silver/copper, and/or bismuth/nickel/copper). A wetting fluid is further applied to the external contact areas. The wetting fluid may be a solution containing a binder, an inhibitor, and a lubricant. The binder may include, for example, white mineral oil and/or ethyl acetate. The inhibitor may be an aliphatic hydrocarbon. The lubricant may include, for example, methyl oleate and/or castor oil.

The substance is generally not applied to the measuring/testing contacts, but is instead used for wetting the terminals of the electronic components. This prevents contamination of the contact areas before this contamination is transferred to the test contact, which would increase the transition resistance values during subsequent contacting cycles of the test contact with external contact areas. As a result, the yield losses are reduced and the first test sequences do not need to be repeated. This, in turn, increases the production throughput. It is of importance, particularly in the case of critical high-frequency components, that the transition resistance values between a test contact and the external contact areas remain low. The measuring accuracy is improved by means of the method according to the invention.

In one embodiment of the invention, the test contact is a pogo pin. When a pogo pin is mechanically pressed onto the external contact area, cracks in the galvanic coating of the external contact areas are produced. Along these cracks, there can be increased contamination. This contamination is prevented by applying the wetting fluid. As a result, the pogo pins are exposed to less contamination, and the contacts need to be cleaned less frequently. This also increases the life of the pogo pins.

DETAILED DESCRIPTION OF THE INVENTION

Figure 1:
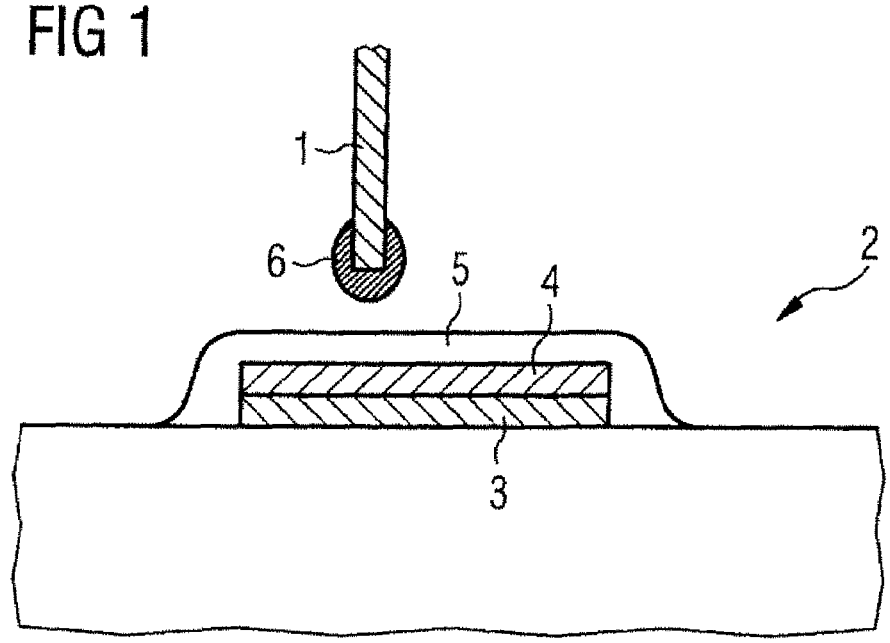
FIG. 1 illustrates a cross sectional view of a semiconductor component according to an embodiment of the invention, showing an external contact area and a test contact.

FIG. 1 shows a semiconductor component and a test contact according to an embodiment of the invention. As shown, the semiconductor component 2 includes an external contact area 3 on which a layer of solderable material 4 may be applied. The layer of solderable material 4 (also called a solderable layer) may include a metal (e.g., tin) or a metal alloy (e.g., tin/lead, tin/lead/silver, bismuth/silver/copper, and/or bismuth/nickel/copper). The solderable layer 4 may be applied using processes including, but not limited to, galvanic processes. In this context, galvanic deposition is understood to be both a current-less deposition from a chemical bath and an electrolytic deposition with current in an electrolyte bath.

The solderable material enables the external contact areas 3 to be connected directly to corresponding contact areas of a higher-level circuit system of a metal or of a metal alloy that is galvanically applied. By way of specific example, the solderable layer 4 may include a tin/lead/silver alloy, wherein tin is contained with approximately 50 to 70 atomic %, lead with approximately 30 to 40 atomic %, and silver with approximately 1 to 10 atomic %. The metal alloy may further include a bismuth/silver/copper alloy having approximately 50 to 80 atomic % bismuth, 5 to 40 atomic % silver, and 0.5 to 15 atomic % copper. By way of further example, an alloy based on bismuth/nickel/copper may have approximately 50 to 85 atomic % bismuth, 15 to 45 atomic % copper, and 0.5 to 5 atomic % nickel.

Then, before establishing contact between the external contact area 3 and the test contact 1, a wetting fluid 5 may applied over the external contact area 3 such that it encloses the solderable layer 4. Establishing contact is here understood to be the mechanical contacting of the test contact 1 (e.g., by means of its test head) to the semiconductor component 2. The wetting fluid 5 may be a solution containing a binder (also called a coupling means or solvent), an inhibitor, and a lubricant. The binder may include, but is not limited to, white mineral oil and/or ethyl acetate. The inhibitor may be an aliphatic hydrocarbon. The lubricant may include, for example, methyl oleate and/or castor oil. Once the fluid 5 wets the contact area 3, the head 6 of the test contact 1 is conducted from the top onto the external contact area 3. By way of specific example, the test contact 1 may include a pogo pin with a head 6 formed of hard gold.

Applying the wetting fluid 5 to the external contact area 3 prevents contamination of the contact area before this contamination is transferred to the test contact 1, which would increase the transition resistance values during subsequent contacting cycles of the test contact with external contact areas. Thus, the presence of the wetting fluid 5 produces a very low, relatively constant transition resistance during contact of the test contact 1 with the semiconductor component 2, even when contact is frequent. The fluid 5 prevents contamination of the contact surfaces of the semiconductor component 2 (e.g., by oxidation or sulfidation). The wetting fluid 5 may have a reducing effect, protecting against further oxidation. Thus, better contact of the base material is provided since existing oxide layers are interrupted and/or loosened by the fluid 5.

In addition, if the wetting fluid 5 is dried before contact is established, there is no risk that the test contact 1 displaces the fluid and removes it from the contact points between test contact and the external contact area 3. During the drying, the solvents of the fluid have dried up, whereas the active substances of the fluid remain on the contact surfaces.

Figure 2:
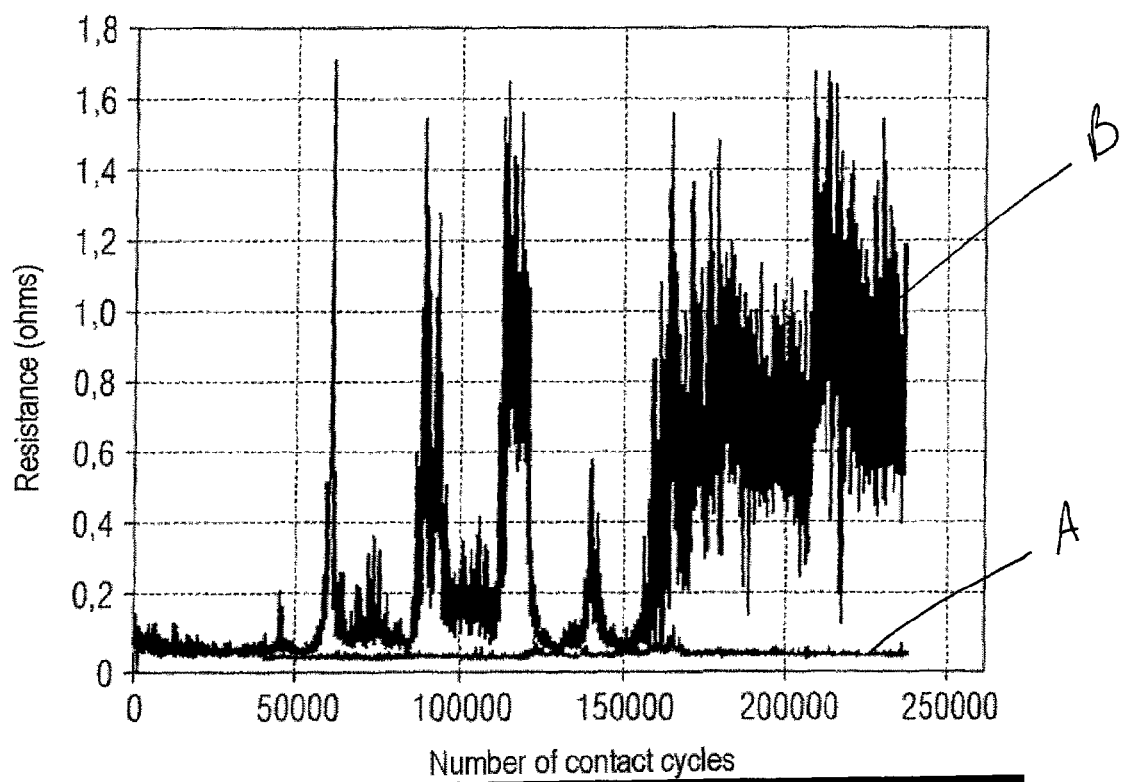
FIG. 2. illustrates a graph plotting the contact resistance values between a test contact and a contact connecting area with a solderable layer including a metal alloy.
Figure 3:
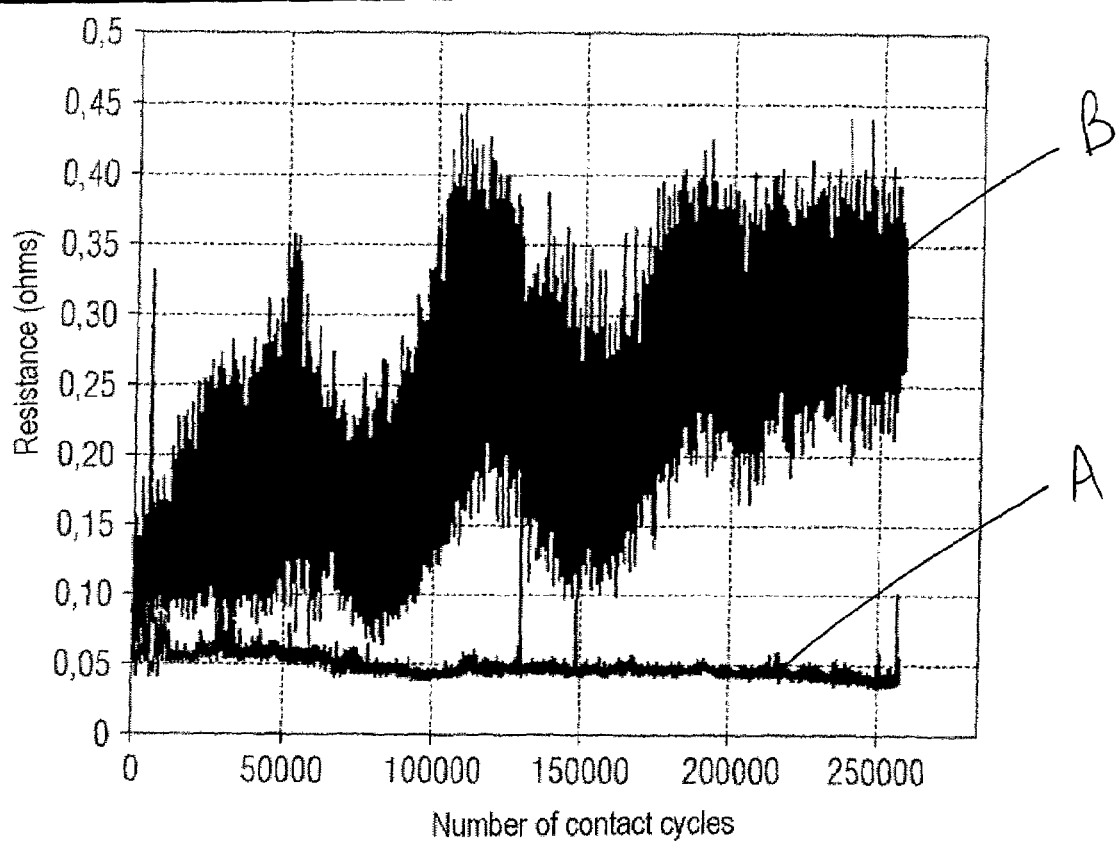
FIG. 3 illustrates a graph plotting the contact resistance values between a test contact and a contact connecting area with a solderable layer including a metal.

FIGS. 2 and 3 are plotted graphs of the resistance values occurring between the test contact 1 and the external contact area 3. In one experiment, a test contact 1 was connected to the external contact area 3 of a pair semiconductor components 2—one with the fluid layer 5 and one without the fluid layer. Specifically, the external contact area 3 of a first semiconductor component 2 was wetted with the fluid 5 before establishing contact with the first test contact 1, while the external contact area 3 of a second semiconductor component 2 was not wetted with the fluid 5 before establishing contact with the second test contact 1. The test contacts 1 were in each case a pogo pin with a head 6 of hard gold. Each test contact 1 was brought into contact with external contact areas 3 250,000 times. In this particular embodiment, the galvanically applied solderable coating 4 was of an alloy including approximately 80 atomic % tin and approximately 20 atomic % lead.

As shown in FIG. 2, the measured resistance between the test contact 1 and the external contact area 3 wetted with the fluid 5 (plotted line A) remained stable at approximately 0.8 ohms, even when contact is established up to 250,000 times. In contrast, the external contact area 3 that was not wetted with the fluid 5 (plotted line B) possesses measured resistance values that vary between 0.08 ohms and 1.7 ohms. In addition, after only 50,000 contact cycles, resistances greater than 0.4 ohms begin to occur.

In a second experiment, the galvanically applied alloy coating 4 was replaced with a tin coating. Referring to FIG. 3, when the external contact area 3 was wetted with the fluid 5, consistent resistance readings of approximately 0.05 ohms are achieved (plotted line A). In contrast, the resistance of the semiconductor component 2 without the fluid 5 (plotted line B) possesses resistance values varying between about 0.5 ohms to about 0.45 ohms. Thus, it can be seen the presence of the wetting fluid 5 produces a very low, relatively constant transition resistance during contact of the test contact 1 with the semiconductor component 2, even when contact is frequent.

List of reference designations:
1 Test contact
2 Semiconductor component
3 External contact area
4 Coating
5 Fluid
6 Gold head

I claim:

1. A method of testing a semiconductor component comprising:
   (a) providing a semiconductor component;
   (b) arranging an external contact area on the semiconductor component;
   (c) applying a solderable layer to the external contact area;
   (d) applying a wetting fluid layer over the solderable layer such that the wetting fluid layer encloses the solderable layer, wherein the wetting fluid layer comprises an aliphatic hydrocarbon;
   (e) drying the wetting fluid layer; and
   (f) contacting a test contact to the semiconductor component,
   wherein the wetting fluid layer is not applied to the test contact, and wherein the wetting fluid layer is dried before contact is established to prevent the displacement and removal of the wetting fluid layer from the solderable layer by the test contact.

2. The method of claim 1, wherein the wetting fluid layer further comprises a binder and a lubricant.

3. The method of claim 2, wherein:
   the lubricant is selected from the group consisting of methyl oleate and castor oil; and
   the binder is selected from the group consisting of white mineral oil, ethyl acetate, and mixtures thereof.

4. The method of claim 1, wherein step (c) comprises (c.1) galvanically applying a solderable layer including a metal.

5. The method of claim 1, wherein step (c) comprises (c.1) galvanically applying a solderable layer including a metal alloy.

6. The method of claim 5, wherein the metal alloy is selected from the group consisting of a tin-lead alloy, tin-lead-silver alloy, a bismuth-silver-copper alloy, and bismuth-nickel-copper alloy.

7. The method of claim 1, wherein the wetting fluid is effective to reduce the transition resistance value measured between the test contact and the external contact area in comparison to a semiconductor component excluding the wetting fluid layer.

8. The method of claim 1, wherein the test contact is repeatedly brought into contact with the fluid layer applied to the external contact area.

9. A method for contacting an external contact area of a semiconductor component repeatedly with a test contact, the method comprising, in order:
   (a) obtaining a semiconductor component having an external contact area;
   (b) galvanically applying a coating of a metal or a metal alloy to the external contact area;
   (c) applying a fluid to the galvanically applied coating, wherein the fluid is effective to reduce the transition resistance value measured between a test contact and the external contact area, the fluid including an inhibitor comprising an aliphatic hydrocarbon, a binder comprising white mineral oil and ethyl acetate, and one or more lubricants;

(d) contacting a test contact to the coated contact area; and (e) drying the fluid before contacting the test contact to the coated external contact area.

10. The method of claim 9, wherein the test contact comprises a pogo pin.

11. The method of claim 9, wherein the galvanically applied coating comprises a metal the metal alloy selected from the group consisting of a tin-lead alloy, tin-lead-silver alloy, a bismuth-silver-copper alloy, and bismuth-nickel-copper alloy.

* * * * *